(12) United States Patent
Yang et al.

(10) Patent No.: US 7,080,897 B2
(45) Date of Patent: Jul. 25, 2006

(54) SYSTEM FOR DELIVERING MATERIAL ONTO A SUBSTRATE

(75) Inventors: Chung C. Yang, Saratoga, CA (US); Gary Gibson, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 278 days.

(21) Appl. No.: 10/697,974

(22) Filed: Oct. 31, 2003

(65) Prior Publication Data

US 2005/0093938 A1 May 5, 2005

(51) Int. Cl.
*B41J 2/02* (2006.01)
*B41J 2/04* (2006.01)

(52) U.S. Cl. ............... 347/75; 347/73; 347/54
(58) Field of Classification Search ............ 347/73–83, 347/6, 54–57
See application file for complete search history.

(56) References Cited

U.S. PATENT DOCUMENTS

| | | | |
|---|---|---|---|
| 3,484,794 A | | 12/1969 | Winston |
| 3,916,421 A | * | 10/1975 | Hertz .......................... 347/73 |
| 4,281,332 A | * | 7/1981 | Horike .......................... 347/6 |
| 4,319,251 A | | 3/1982 | Keur |
| 4,620,198 A | | 10/1986 | Behun |
| 5,481,288 A | * | 1/1996 | Keeling et al. ............... 347/80 |
| 6,401,001 B1 | | 6/2002 | Jang et al. |
| 6,413,790 B1 | | 7/2002 | Duthaler et al. |
| 6,520,402 B1 | | 2/2003 | Orme-Marmerelis |
| 6,521,489 B1 | | 2/2003 | Duthaler et al. |

FOREIGN PATENT DOCUMENTS

JP 56008272 A 4/1981

OTHER PUBLICATIONS

Yoshiko Hara; Inkjet Wiring Advances "Desktop Factory" Goal; www.eet.com; Nov. 8, 2004; 2 pages.
Eschbach and Rezanka, "Recent Progress in Ink-Jet Technlogies I", Electrostatic Source, 1996.
Hardman, Tony, "Inkjet Printer Operation", Printer Cartridges Ink, 1996.
Easen, Nick, "Want a PC this Xmas? Then Print it", CNN, Sep. 28, 2003, http://www.cnn.com/2003/TECH/09/24/wow.tech.santa.printer/index.html.
Nelson, Amy, "Rayleigh Instability of an Annulus", ChE 385M: Surface Phenomena, May 4, 2000.

(Continued)

*Primary Examiner*—K. Feggins

(57) ABSTRACT

A system for delivering material onto a substrate. The system includes a jetting system having a reservoir containing the material and the reservoir includes a nozzle through which the material is expelled from the reservoir. An arcuate section is positioned between the reservoir and the nozzle. The material is configured to travel from the reservoir, through the arcuate section, and through the nozzle. The system also includes a means for applying pressure on the material contained in the reservoir, wherein the material is expelled from the reservoir through application of pressure by the means for applying pressure to thereby create a column of the material from the nozzle. A means for producing pressure modulations is located proximate the nozzle and is configured to substantially regulate formation of droplets from the column of the material. In addition, the system includes a charging ring configured to induce an electrical charge to selective ones of the droplets as they pass through the charging ring. One or more deflection plates is also included for altering a trajectory of the charged droplets.

43 Claims, 5 Drawing Sheets

OTHER PUBLICATIONS

MicroFab Technote 99-01 Background on Ink-Jet Technology, Sep. 28, 1999.

Calvert, Paul, "Inkjet Printing for Materials and Devices", Dept of Materials Science & Engineering, Univ. of Arizona, 2001.

Darhuber, Anton; Trojan, Sandra; Miller, Scott; "Morphology of liquid microstructures on chemically patterned surfaces", Journal of Applied Physics, vol. 87, No. 11, Jun. 2000.

Jaworek, Anatol; Krupa, Andrzej; "Electrohydrodynamic Spraying", http://www.imp.gda.pl/ehd/ehd_spry.html.

Jaworek, A.; Krupa, A.; "Main Modes of Electrohydrodynamic Spraying of Liquids", ICMF Jun. 1998.

Lin, S.P.; Hudman, M.; Chen, J.N.; "Absolute and Convective Instability of a Liquid Jet", Clarkson University.

Canney, John; Risner, Jeremy; Subramanian, Vivek; "Flexonics" Electrical Engineering and Computer Sciences, Univ. of California, Berkeley.

Tseng, Fan-Gang, "Micro-Droplet Generators", National Tsing Hua University, Taiwan.

Fel, Leonid G.; Zimmels, Yoram; "Rayleigh Instability in Liquid Crystalline Jet" Dept of Civil Engineering, Technion, Isreal, Nov. 4, 2002.

Prof. Dr. -Ing, Wolfgang Wehl, "Tintendruck: Strahlt er oder strahlt er nicht, das ist hier die Frage!", http://www.mm.fh-heilbronn.de/wehl/literat/tidruck.htm.

* cited by examiner

SYSTEM FOR DELIVERING MATERIAL ONTO A SUBSTRATE

BACKGROUND OF THE INVENTION

Inkjet technology, which is well known for use in printing images onto paper, has also been employed in the fabrication of printed circuits. More particularly, inkjet printheads utilizing either thermal inkjet (TIJ) or piezoelectric (PZT) transducers have been employed to directly print circuit components onto circuit substrates.

There are two common manners in which fluid may be jetted from the printheads. One manner is known as drop-on-demand (DOD) and the other manner is known as continuous ink-jet (CIJ). As the name suggests, DOD systems include systems designed to eject fluid through application of a voltage through a PZT element or a thin film resistor element when a drop is desired. CIJ systems, on the other hand, include systems designed to jet a stream of fluid which break up into droplets due to Rayleigh instability. In comparing these types of systems, DOD systems are typically less complicated than CIJ systems, but DOD print heads have more complex fluidic design concerns and the DOD systems typically require three or more orders of magnitude greater energy to produce a droplet than CIJ systems because the fluid flow direction reverses during drop formation and break off. In addition, CIJ systems are typically less susceptible to nozzle imperfections than DOD systems. Therefore, manufacturing tolerances for nozzles implemented in DOD systems are typically much lower than those for nozzles implemented in CIJ systems. One result is that the costs associated with producing the CIJ system nozzles are oftentimes lower than those costs associated with producing the DOD system nozzles.

TIJ type printheads typically include a thin-film resistor for applying heat to superheat a small portion of the printing material near the heater element. During super-heating, a bubble of vaporized material is created and the explosive growth of the bubble expels the fluid in the nozzle of the printhead beyond the orifice to form droplets. The thin-film resistor is therefore positioned near the nozzle and the printing material is fed to a location between the thin-film resistor and the nozzle opening. The use of TIJ type printheads is substantially limited by the types of materials that may be ejected from the printheads. For instance, TIJ type printheads may be unable to supply sufficient heat power to super-heat high melting temperature, thermally conductive materials. Another drawback associated with the use of TIJ type printheads in printing circuit components is that its drop frequency is limited by the ac impedance associated with its fluidic circuit because it employs drop-on-demand type ac operation.

PZT, or lead-zirconate-titanate, type printheads typically include a transducer component whose volume changes when it receives a voltage pulse. This volumetric change generates a pressure wave (acoustic wave) that propels the printing material through a nozzle of the printhead. PZT type printheads are not suitable for use in the typically high temperature environments necessary for application of electrically conductive materials, e.g., metals, inorganic semiconductors and ceramics because PZT elements commonly used as the actuators are limited by the depolarization temperatures for their ferroelectricity.

SUMMARY OF THE INVENTION

According to an embodiment, the present invention pertains to a system for delivering material onto a substrate. The system includes a jetting assembly having a reservoir containing the material and the reservoir includes a nozzle through which the material is expelled from the reservoir. An arcuate section is positioned between the reservoir and the nozzle. The material is configured to travel from the reservoir, through the arcuate section, and through the nozzle. The system also includes a means for applying a static pressure on the material contained in the reservoir, wherein the material is expelled from the reservoir through application of pressure by the means for applying pressure to thereby create a column of the material from the nozzle. A means for producing acoustic modulation is incorporated to the reservoir and is configured to provide acoustic perturbation to the Rayleigh instability and help regulate formation of droplets from the column of the material. In addition, the system includes a charging ring configured to apply an electrical charge to selective ones of the droplets as they pass through the charging ring. One or more deflection plates are also included for altering a trajectory of the charged droplets.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1A:
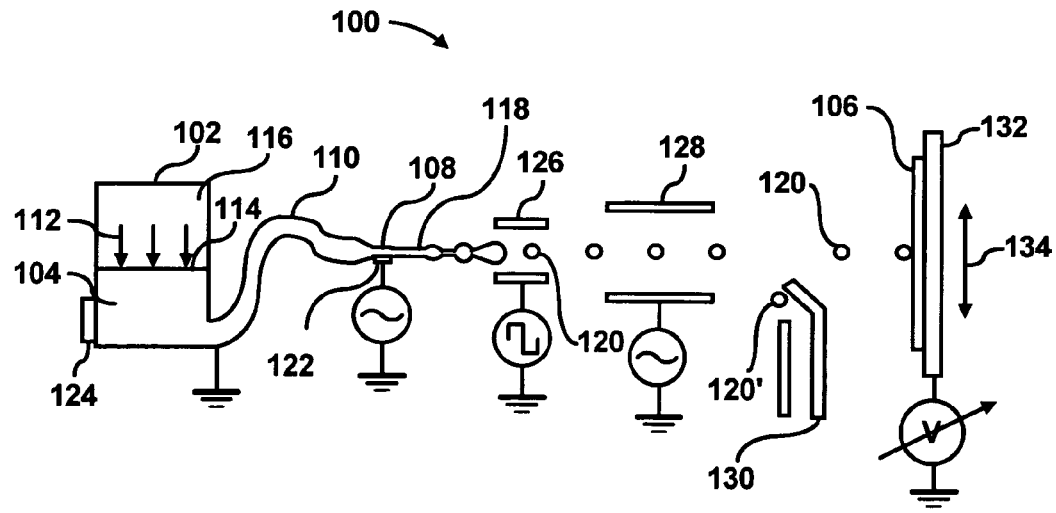
FIG. 1A shows a schematic illustration of a system for delivering material onto a substrate, according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

According to embodiments of the invention, a system is configured to accurately and efficiently deliver materials for use in the fabrication of electronic circuits to a substrate. The system generally implements a continuous inkjet (CIJ) printing technique, in that, the material is jetted from a reservoir, without flow reversal in the jet nozzle, in a substantially continuous manner. The material is ejected from the reservoir through application of static pressure to a relatively large surface of the material and the material is ejected from a nozzle of the reservoir generally as a fluid column which breaks-up into droplets due to Rayleigh instability. In this regard, it is unnecessary to employ a PZT transducer or a thin-film resistor to expel the material from the reservoir. A transducer or other electromechanical device may be incorporated to the reservoir and may operate to regulate droplet formation. Once formed, the droplets travel through a charging ring and some or all of the droplets receive an electrical charge.

According to an embodiment, a deflection plate or a plurality of deflection plates may divert the charged ones of the droplets to a collection plate designed to receive unwanted droplets. The discarded droplets received by the collection plate may be recycled back to the reservoir or they may be sent to a waste area. In this embodiment, the uncharged droplets travel to the substrate and may be deposited thereon. In addition, the deflection plate(s) may be configured to divert all of the charged ones of the droplets to the collection plate. Changing the relative positions of the jet nozzle and the substrate may vary the locations of droplet attachment. For instance, the jet reservoir or the substrate may be mounted on a support plate configured to move in of one or more dimensions. In this manner, the droplets may be attached to the substrate at various locations thereof.

According to another embodiment, substantially all of the droplets traveling though the charging ring may receive a charge. The deflection plate(s) may be operated to control the flight path of the droplets. In general, the deflection plate(s) may cause some or all of the droplets to be diverted to the collection plate or the substrate. In addition, the deflection plate(s) may also vary the flight path of the droplets configured for attachment to the substrate to thereby control the locations of droplet attachments onto the substrate.

Through implementation of the system according to embodiments of the invention, electronic circuits may be manufactured in a relatively simple and efficient manner. In addition, the means for jetting the materials from the reservoir does not suffer from the drawbacks associated with known mechanisms for printing circuit materials onto substrates.

FIG. 1A shows a schematic illustration of a system 100 for delivering material onto a substrate, according to an embodiment of the invention. The system includes a jetting assembly having a reservoir 102 for containing the material 104 to be delivered to the substrate 106. According to an embodiment of the invention, the reservoir 102 comprises a material that is chemically non-reactive with the material 104. Alternatively, the reservoir 102 may include an interior lining that is chemically non-reactive with the material 104. The material 104 may comprise any reasonably suitable material configured for use in the fabrication of electronic circuits, e.g., semiconductor, metal, dielectric, passivation materials, etchant, dopant, reactant, protective coatings, etc. The reservoir 102 includes a nozzle 108 through which the material 104 is ejected. An arcuate, e.g., curved, arched, etc., section 110 is positioned in the path of the material flow between the reservoir 102 and the nozzle 108. As will be described in greater detail herein below, the arcuate section 110 may be useful in preventing blockage of the nozzle 108.

A pressure, as indicated by the arrows 112, may be applied onto a relatively large portion of the surface 114 of the material 104 contained in the reservoir 102 to cause the material 104 to be ejected through the nozzle 108. The pressure may also be applied in a substantially constant and uniform manner. The material 104 is jetted from the nozzle 108 in a substantially continuous manner through application of the pressure. The pressure applied to the material 104 may be applied by any reasonably suitable means for applying substantially uniform pressure onto the relatively large surface 114 of the material 104. Suitable means may include a gas, e.g., air, nitrogen, argon, or other suitable gas, supplied into an open space 116 between the material surface 114 and the reservoir 102. The suitable means may also include pressure applied to the material through introduction of additional material 104 into the reservoir 102. The means for applying pressure may also include mechanical devices, such as, a movable plunger, a diaphram or plate positioned to apply pressure onto the surface 114.

In any regard, the material 104 is jetted as a fluid column 118 from the nozzle 108. The length of the fluid column 118 as well as the velocity in which the fluid column 118 is ejected from the nozzle 108 may substantially be controlled by varying the pressure applied to the material 104. As the fluid column 118 reaches a critical length, depending upon the pressure applied to the material 104, the continuity of the fluid column 118 collapses due to capillary stream break-up and droplets 120 are formed. The phenomena of droplet 120 formation from a liquid stream, e.g., the fluid column 118, is dictated by the Rayleigh instability. In part, Rayleigh discovered that fluid under pressure issuing from an orifice breaks up into uniform drops by the amplification of capillary waves induced into the liquid stream. A lead-zirconate-titanate (PZT) transducer 122 is positioned proximate the nozzle 108 and generally operates to produce pressure oscillations or modulations to propagate through the fluid column 118. The PZT transducer 122 may be positioned outside of the nozzle 108 in any reasonably suitable manner to substantially prevent heat from the material 104 from adversely affecting operations of the PZT transducer 122. In one regard, a thermally insulating material (not shown) may be provided as an interface between the PZT transducer and the nozzle 108.

Although FIG. 1A is disclosed as employing a PZT transducer 122 to produce pressure modulations, any reasonably suitable electromechanical device capable of producing suitable pressure modulations may be employed without departing from the scope of the invention.

A heating element 124 may be positioned to supply heat to the material 104. The heating element 124 may comprise any heating element configured to supply sufficient heat power to the material 104 to maintain the material 104 in a substantially liquid form. In this regard, the heating element 124 may be selected, for instance, according to the composition of the material contained in the reservoir 102. The depiction of the heating element 124 position in FIG. 1A is for illustrative purposes only and is not meant to limit the invention in any respect. In addition, therefore, the heating element 124 may be positioned at any reasonably suitable location with respect to the reservoir 102, including being positioned within the reservoir 102, without departing from the scope of the invention.

A charging ring 126 is positioned along the flight path of the droplets 120, such that the droplets 120 are configured to pass through the charging ring 126. According to an embodiment of the invention, the charging ring 126 may be positioned substantially near the location of droplet 120 formation from the fluid column 118. The charging ring 126 generally comprises a conductive device configured to induce a charge to the droplets 120 capacitively or inductively. For capacitive coupling, the voltage polarity that is applied to the charging ring 126 with the fluid column 118 electrically grounded through the reservoir 102, determines the charge polarity of the charged droplets. In this regard, the charging ring 126 is configured to receive an electrostatic potential and to induce a charge to the droplets 120. The droplets 120 may retain the charge it receives from the charging ring 126 as they break off from the fluid column 118. Droplets 120 remain neutral if the electrostatic potential at the charging ring 126 is absent during break off.

Also located in the flight path of the droplets 120 is a pair of deflection plates 128. The deflection plates 128 are also electrically conductive devices configured to receive and transmit electrstatic potential. An electrostatic potential may be applied to the deflection plates 128 to alter the direction of droplet 120 travel. For instance, a substantially constant potential may be applied to the deflection plates 128 such that all of the droplets 120, e.g., unwanted droplets 120', that receive a charge from the charging ring 126 are diverted to a collection plate 130. In this example, the neutral droplets 120 travel past the deflection plates 128 and are deposited on the substrate 106. As an alternative, some or all of the droplets 120 may receive a charge from the charging ring 126 and the deflection plates 128 may be operated in a manner to divert certain ones or all of the droplets 120, e.g., the unwanted droplets 120', to the collection plate 130.

According to an embodiment of the invention, the deflection plates 128 may be operated in a manner to alter the trajectories of certain ones of the charged droplets 120. More particularly, the deflection plates 128 may be operated to divert droplets 120 having certain charge/mass ratios that fall outside of a predetermined charge/mass ratio range. For instance, the droplets 120 may obtain a charge dependent on their masses and those droplets 120 having a certain ratio of charge to mass, e.g., smaller droplets 120, may be considered unwanted droplets 120' and may be diverted to the collection plate 130. Alternatively, those droplets 120 having the certain charge, e.g., smaller droplets 120, may pass through the deflector plates 128 and become deposited on the substrate 106. In one regard, the deflection plates 128 may be operated to emit an electrostatic potential having sufficient strength to cause the trajectories of the droplets 120 having the certain charges to be diverted.

The collection plate 130 may comprise a means for gathering unwanted droplets 120' and a means for recycling the unused or unwanted droplets 120'. In this regard, the collection plate 130 may include a heating element (not shown) configured to maintain the unwanted droplets 120' in liquid form. In addition, the collection plate 130 may include a means for conveying the unused material 104 back to the reservoir 102 for re-use. The means for conveying may include a pump or other device known for use in manipulating fluids.

The droplets 120 that are not diverted to the collection plate 130 are substantially free to travel to and impact the substrate 106. In the embodiment illustrated in FIG. 1A, the substrate 106 is mounted on a movable support plate 132. An arrow 134 is illustrated to indicate that the support plate 132 may be moved in a vertical motion parallel to the plane of FIG. 1A. According to certain embodiments, the support plate 132 may also be moved in a direction into and out of the plane of FIG. 1A, or both.

Through relative movement between the support plate 132 and the trajectories of the droplets 120, placement of the droplets 120 onto the substrate 106 may substantially be controlled. In the example above, the locations of the droplet 120 placements may be controlled in two dimensions.

According to another embodiment, the assembly of the reservoir 102, the charging ring 126, the deflection plates 128 and the collection plate 130 could be mounted onto the support plate 132 to provide relative motion with respect to the substrate 106. In this case, the support plate 132 is not required to be located behind the substrate 106. According to yet another embodiment, the support plate 132 may be configured to move in only one dimension, e.g., in the directions shown by the arrow 134. In any regard, the droplets 120 may be deposited on the substrate 106 with at least two degrees of freedom. A third degree of freedom may be available through stacking of the droplets 120 upon each other to form, for instance, a layered structure.

According to an embodiment of the invention, a plurality of reservoirs 102 may be positioned, for instance, in a direction along an axis that extends into the plane of FIG. 1A or parallel to the plane of FIG. 1A. In addition, the plurality of reservoirs 102 may contain the same or different materials 104. Therefore, according to this embodiment of the invention, droplets 120 may be applied to various locations on the substrate 106 to form an electronic circuit through movement of the support plate 132 along one dimension. Moreover, the electronic circuit may be formed through application of various materials in a substantially simultaneous manner.

The support plate 132 may be configured to receive an electrostatic potential. The electrostatic potential received by the support plate 132 may be applied to either retard or accelerate the drop velocity of the droplets 120. For instance, if the droplets 120 are negatively charged, their drop velocities may be retarded by applying a negative electrostatic potential to the support plate 132. Conversely, the velocities of the droplets 120 may be accelerated by applying a positive electrostatic potential to the support plate 132. Therefore, the variance in the velocities of the droplets 120 is another control parameter that may be useful in manipulating deposition of the droplets 120 onto the substrate 106.

As previously stated hereinabove, the arcuate section 110 may be useful in preventing blockage of the nozzle 108. The configuration of the reservoir 102 illustrated in FIG. 1A requires that the material 104 flow through the arcuate section 110 prior to being jetted through the nozzle 108. In addition, the nozzle 108 has a relatively higher position as compared to the height of the material surface 114. Thus, when the pressure applying means 112 ceases to apply pressure to the material 104, the material 104 contained in the arcuate section 110 is caused to either flow back into a main cavity of the reservoir 102 or out of the nozzle 108. In this regard, the arcuate section 110 substantially prevents the material 104 from settling in a location near the nozzle 108. In one regard, therefore, the material 104 is substantially prevented from drying up and clogging the nozzle 108.

Although not shown in FIG. 1A, the reservoir 102 may include the re-filling device 154 shown in FIG. 1B and described hereinbelow with respect to FIG. 1B. Additional material 104, having either the same or different composition, may therefore be inserted into the reservoir 102.

According to another embodiment of the invention, the reservoir 102 may comprise a replaceable component in the system 100. That is, for instance, the reservoir 102 may be removably attached to the arcuate section 110 such that the reservoir 102 may be replaced when the material 104 contained therein is spent or when a different reservoir 102 containing a different material is to be employed in the system 100. As another example, the reservoir 102, the arcuate section 110, the nozzle 108, and the PZT transducer 122, may comprise an integrally manufactured component that may be replaced in, for instance, the situations described above.

Figure 1B:
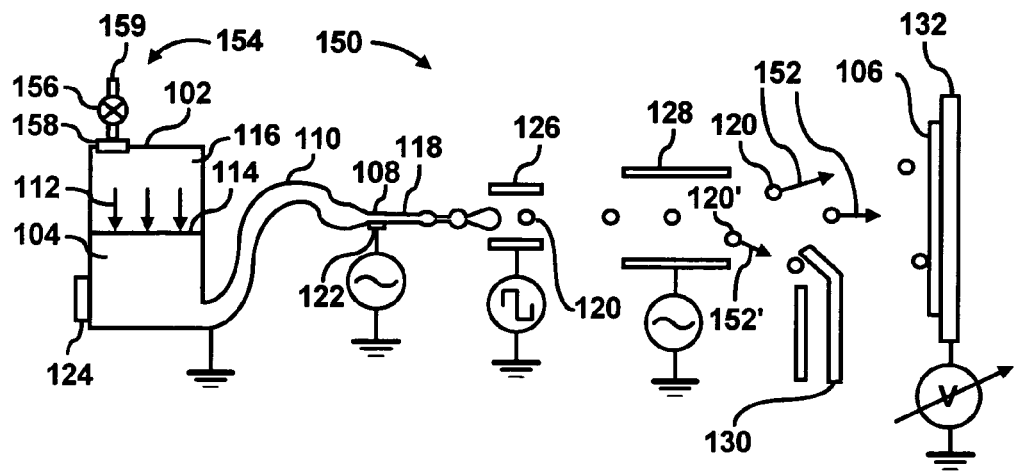
FIG. 1B shows a schematic illustration of a system for delivering material onto a substrate, according to another embodiment of the invention.

FIG. 1B shows a schematic illustration of a system 150 for delivering material onto a substrate, according to another embodiment of the invention. The system 150 includes all of the elements set forth hereinabove with respect to FIG. 1A. Therefore, the following discussion of FIG. 1B is set forth with the understanding that those components not specifically addressed are to be understood as having been described hereinabove with respect to FIG. 1A. However, as described hereinbelow, some of the components may be operated in manners that differ from those described hereinabove with respect to FIG. 1A. More particularly, the charging ring 126 may apply an electrical charge to each of the droplets 120 passing therethrough. In addition, the deflection plates 128 may also be operated to control the trajectories of each of the droplets 120 as indicated by the arrows 152 and 152'.

In one respect, the deflection plates 128 may operate to control the trajectories of the droplets 120 by varying the level of electrostatic charge applied to the upper or lower deflection plate. For instance, if the droplets 120 are negatively charged, the trajectory of a droplet 120 may be altered such that the droplet 120 is to land or impact at a higher location on the substrate 106. In this example, the upper deflection plate may be charged with a positive potential and the lower deflection may be charged with a negative potential such that the droplet 120 will be attracted to the upper deflection plate and will be repelled from the lower deflection plate.

As shown in FIG. 1B, some of the droplets 120, e.g., unwanted droplets 120', may be discarded by altering their trajectories toward the collection plate 130, as illustrated by the arrow 152'. In addition, the trajectories of the remaining droplets 120 may be controlled such that they hit the substrate 106 at various 2-dimensional locations along a vertical plane of FIG. 1B with the application of another pair of deflection plates (not shown) that is orthogonal to the deflection plates 128 to achieve a two degree of freedom deposistion of material 104 onto the substrate 106. According to an embodiment, the support plate 132 may be moved along axes that extend into and parallel to FIG. 1B respectively. The additional two dimensional movement of the support plate 132 will extend the two dimensional deflection range of the deflection plates 128' in a block-by-block manner to cover the entire substrate 106. According to another embodiment, the support plate 134 may be relatively fixed and a plurality of reservoirs 102 may be positioned along an axis that is either in the plane of or extends into FIG. 1B. In any regard, the droplets 120 may be deposited on the substrate 106 with at least two degrees of freedom. A third degree of freedom may be available through stacking of the droplets 120 upon each other to form, for instance, a layered structure.

FIG. 1B also illustrates a re-filling device 154 composed of a valve 156 and an opening 158 in the reservoir 102. The re-filling device 154 enables additional material 104 to be inserted into the reservoir 102. The re-filling device 154 may include an interface 159 to enable connection of the re-filling device 154 to, for instance, a supply tank of the additional material.

Although the re-filling device 154 has been illustrated as containing a valve 156 positioned through an opening 158 in the reservoir 102, it should be understood that other devices suitable for enabling insertion of material 104 into the reservoir 102 may be employed without departing from the scope of the invention. These devices may include, for instance, a cap to cover the opening 158, a seal, a septum, and the like. In addition, a syringe-like apparatus may be employed to inject material 104 into the reservoir 102 without departing from the scope of the invention.

According to another embodiment of the invention, the reservoir 102 may comprise a replaceable component in the system 150. That is, for instance, the reservoir 102 may be removably attached to the arcuate section 110 such that the reservoir 102 may be replaced when the material 104 contained therein is spent or when a different reservoir 102 containing a different material is to be employed in the system 150. As another example, the reservoir 102, the arcuate section 110, the nozzle 108, and the PZT transducer 122, may comprise an integrally manufactured component that may be replaced in, for instance, the situations described above.

Figure 1C:
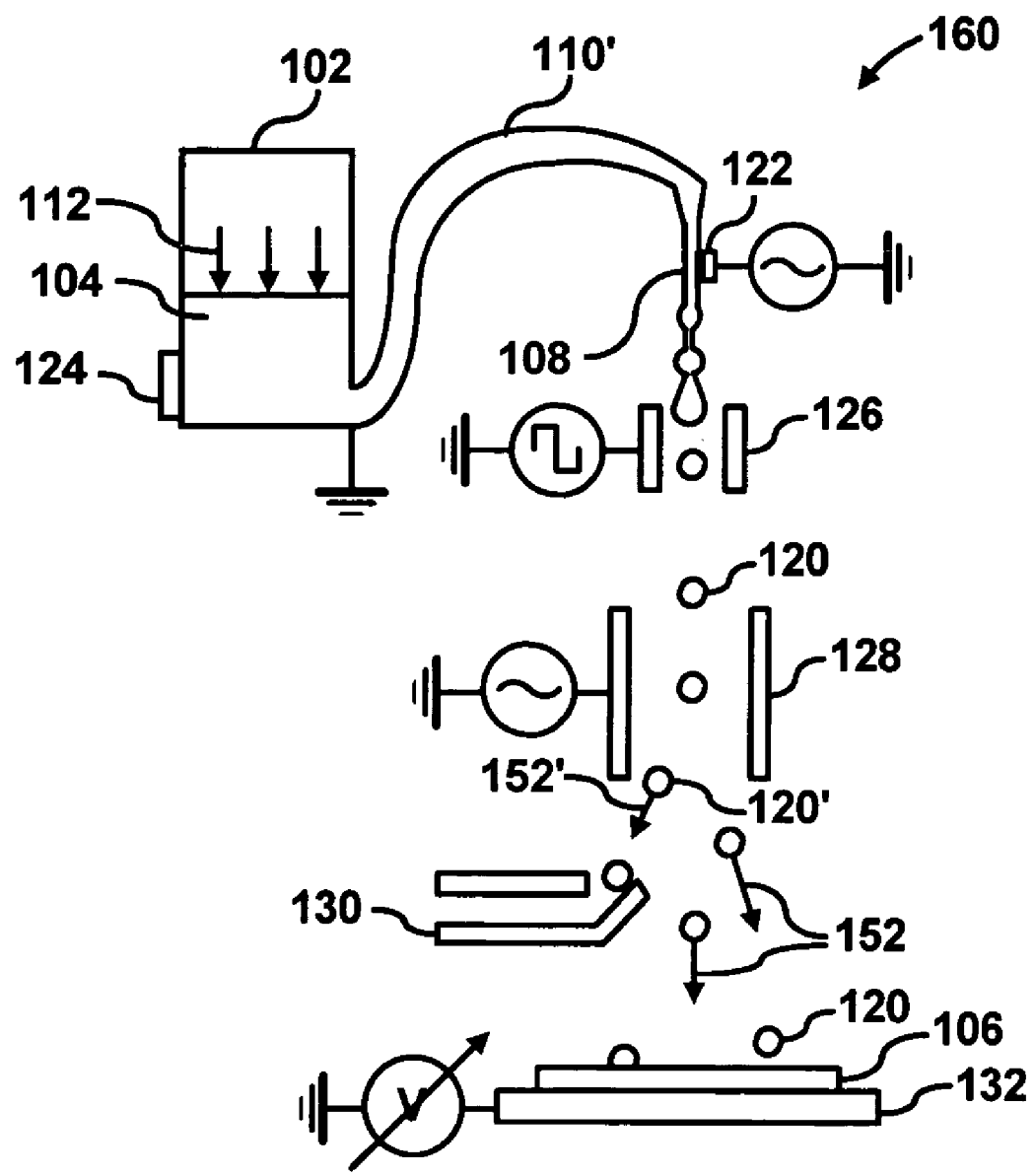
FIG. 1C shows a schematic illustration of a system for delivering material onto a substrate, according to yet another embodiment of the invention.

FIG. 1C shows a schematic illustration of a system 160 for delivering material onto a substrate, according to yet another embodiment of the invention. The system 160 includes all of the elements set forth hereinabove with respect to FIG. 1B. Therefore, the following discussion of FIG. 1C is presented with the understanding that those components not specifically addressed are to be understood as having been described hereinabove with respect to either FIG. 1A or FIG. 1B. In comparing FIG. 1C from FIG. 11B, it is evident that the major distinction between the two systems is the direction in which the material 104 is ejected from the nozzle 108. More particularly, the nozzle 108 is illustrated as opening in a downward direction with respect to FIG. 1C.

In addition, the arcuate section 110' is depicted as having a relatively larger height than the arcuate section 110 shown in FIGS. 1A and 1B. Based upon the configuration of the arcuate section 110', as the pressure applied to the material 104 is decreased beyond a predetermined level, the material 104 in the arcuate section 110' located on a first side of the arcuate section 110' is caused to either flow back into the reservoir 102 or remain in the arcuate section 110'. The material 104 located on a second side of the arcuate section 110' is caused to flow out of the nozzle 108 by virtue of the configuration of the arcuate section 110'. In this regard, the arcuate section 110' substantially prevents accumulation and dry-up of the material 104 in the nozzle 108. Therefore, the system 160 may remain inactive for relatively long periods of time without concern for nozzle 108 blockage.

Although not shown in FIG. 1C, the reservoir 102 may include the re-filling device 154 shown in FIG. 1B and described with respect to FIG. 1B. Additional material 104, having either the same or different composition, may therefore be inserted into the reservoir 102.

According to another embodiment of the invention, the reservoir 102 may comprise a replaceable component in the system 160. That is, for instance, the reservoir 102 may be removably attached to the arcuate section 110' such that the reservoir 102 may be replaced when the material 104 contained therein is spent or when a different reservoir 102 containing a different material is to be employed in the system 160. As another example, the reservoir 102, the arcuate section 110', the nozzle 108, and the PZT transducer 122, may comprise an integrally manufactured component that may be replaced in, for instance, the situations described above.

FIGS. 1A–1C generally illustrate various embodiments in which materials 104 are added to the substrate 106. According to embodiments of the invention, the materials 104 employed in the systems 100, 150, and 160 may also comprise etchants designed to remove materials in selected regions. For instance, the etchant may be applied onto an area containing unwanted materials. The etchant may contact the unwanted materials and volatize it, for instance, in conjunction with heat and/or light. Alternatively, a first material may be applied onto a second material, in which the first material oxidizes the second material, thereby making the second material insulating.

According to further embodiments, the systems 100, 150, and 160 may be employed in various other manners to assist in the fabrication of electronic circuits. For instance, the systems 100, 150, and 160 may be operated to apply masking layers or resists onto the substrate. The masking layers or resists may then be used in conventional lithographic processes.

Figure 2:
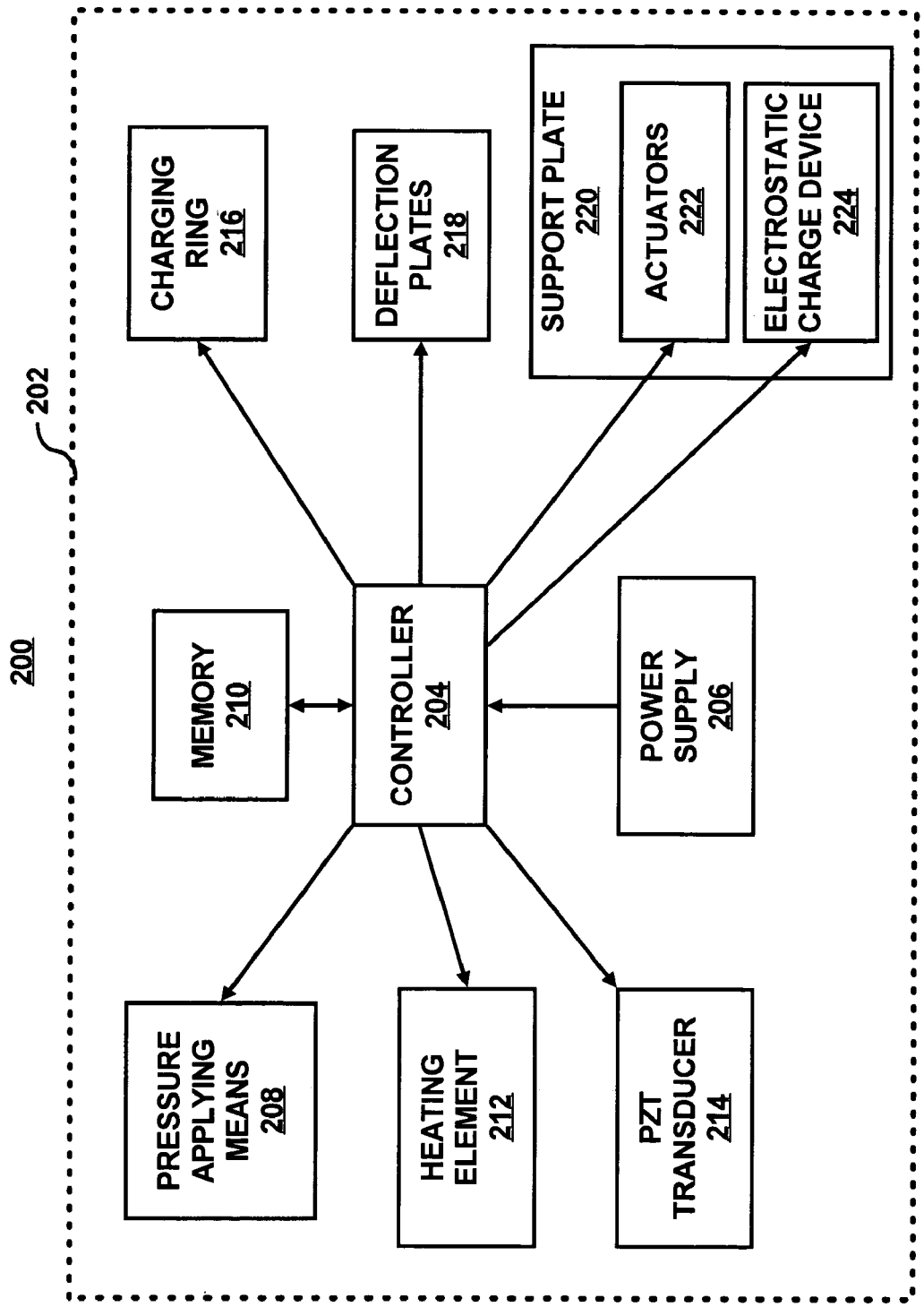
FIG. 2 is an exemplary block diagram of a control scheme for operating a system for delivering material onto a substrate according to an embodiment of the invention.

FIG. 2 is an exemplary block diagram 200 of a control scheme 202 for operating a system for delivering material onto a substrate according to an embodiment of the invention. It should be understood that the following description of the block diagram 200 is but one manner of a variety of different manners in which such a control scheme 202 may be configured. For instance, the control scheme 202 may include any number of controllers and memories configured to operate the various components contained in the material delivering system according to embodiments of the invention. In addition, it should be understood that the block diagram 200 may include additional components and that some of the components described herein may be removed and/or modified without departing from the scope of the invention.

The control scheme 202 includes a controller 204 for controlling operations of the material delivering system, e.g., systems 100, 150, and 160. In this regard, the following discussion of the control scheme 202 makes references to the elements contained in the systems 100, 150, and 160. It is to be understood that the references to these systems 100, 150, and 160 are for purposes of clarity and understanding of various embodiments of the invention and are not meant to limit the invention. Thus, it should also be understood that control scheme 202 may be implemented in systems having configurations that may differ from those described with respect to the systems 100, 150, and 160.

The controller 204 may control comprise a microprocessor, a micro-controller, an application specific integrated circuit (ASIC), and the like. The controller 204 may be interfaced with a power supply 206 and may operate to vary the voltage supplied to one or more components of the material delivering system. For instance, the controller 204 may control the amount of pressure a pressure applying means 208 applies onto a material, e.g., material 104, by varying the amount of voltage supplied to the pressure applying means.

The controller 204 may also be interfaced with a memory 210 configured to provide storage of a computer software that provides the functionality of the controller 204 in operating the material delivery system. The memory 210 may be implemented as a combination of volatile and non-volatile memory, such as DRAM, EEPROM, flash memory, and the like. The device memory 210 may also be configured to provide a storage for containing data/information pertaining to the manner in which the various material delivery system components may be operated to form various electronic circuits.

Based upon algorithms or software stored in the memory 210, the controller 204 may operate some or all of the components of the material delivery system. As stated above, the controller 204 may control the amount of pressure applied to the material by the pressure applying means 208, e.g., pressure applying means 112. In this regard, the fluid column length and its exit velocity from a nozzle may be substantially controlled. In addition, the controller 204 may operate a heating element 212, e.g., heating element 124 to control the temperature of the material contained in the reservoir, e.g., reservoir 102. The controller 204 may operate the heating element 212 by varying the voltage supplied to the heating element 212. In addition, information pertaining to the desired temperatures of various materials to be used in the material delivery system may be stored in the memory 210. The controller 204 may access this information and may operate the heating element 212 to generate varying levels of heat depending upon the material contained in the reservoir.

The controller 204 may also be configured to control the operations of a PZT transducer 214, e.g., PZT transducer 122. The PZT transducer may be electrically connected to the controller 204 and the controller 204 may vary the operations of the PZT transducer by varying the voltage and frequency supplied to the PZT transducer. The controller 204 may also access information stored in the memory 210, for instance a look-up table (not shown), that correlates the voltage and frequency necessary to create a desired oscillation. The information may also contain relevant data pertaining to various voltage and frequency levels needed for various materials.

The controller 204 may also be electrically connected to a charging ring 216, e.g., charging ring 126, and deflection plates 218, e.g., deflection plates 128. The controller 204 may operate to control the electrostatic charge supplied to the charging ring 126 and the deflection plates 218. In one respect, the controller 204 may control the polarity and/or the level of electrostatic charge supplied to the charging ring 126 and the deflection plate 218. The controller 204 may thus control the charge supplied to the droplets, e.g., droplets 120, as they travel past the charging ring 126. In addition, and as described hereinabove, the controller 204 may control the trajectories of the charged droplets by varying the electrostatic potential supplied to the deflection plates 218.

In the control scheme 202, the controller 204 may control various operations of a support plate 220, e.g., support plate 132. For instance, as shown in FIG. 2, the support plate 220 may include one or more actuators 222 configured to manipulate the position of the support plate 220 with respect to, for instance, the deflection plates 218. As described hereinabove, the support plate 220 may be manipulated along the axes of one or more dimensions to enable positioning of the droplets on various locations of the substrate, e.g., substrate 106. The controller 204 may control the actuators 222 to manipulate the support plate 220 in very precise movements to thereby control the positioning of the droplets on the substrate.

The controller 204 may also control the voltage supplied to an electrostatic charge device 224 of the support plate 220. As also described hereinabove, an electrostatic charge may be supplied to the support plate 220 to control either acceleration or deceleration of the droplets as they approach the substrate. Thus, the controller 204 may control the polarity of the electrostatic charge as well as its relative strength to vary the acceleration or deceleration of the droplets.

The controller 204 has been described as controlling operations of some of the material delivery system components through variance of voltage supplied to those components. According to another embodiment of the invention, the controller 204 may operate some or all of the material delivery system components through transmission of control signals to those components. In this regard, some or all of the material delivery system components may include mechanisms designed to operate the components based upon instructions received from the controller 204. For instance, these mechanisms may include separate controllers configured to receive and process the instructions received from the controller 204.

Figure 3:
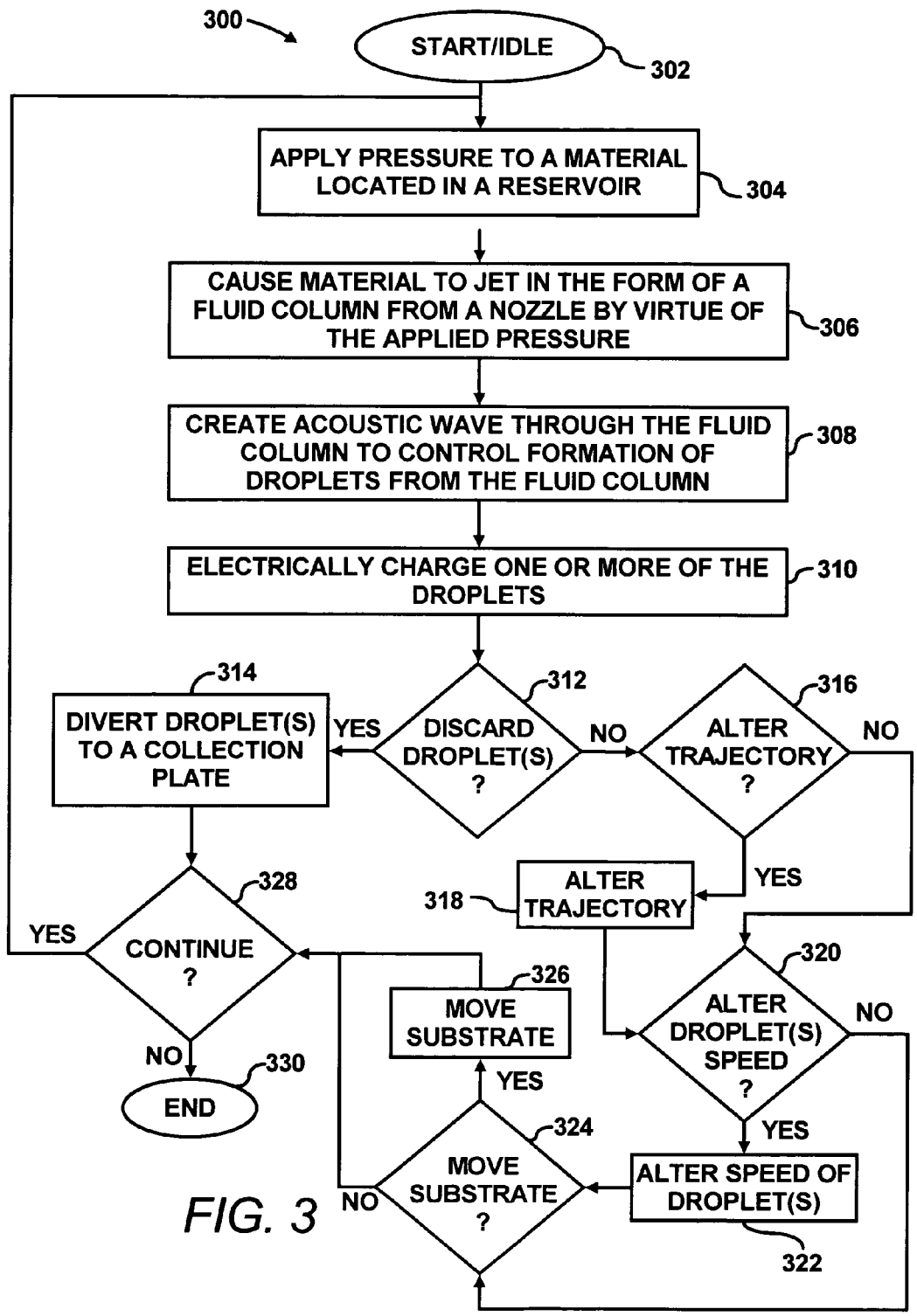
FIG. 3 illustrates an exemplary flow diagram of an operational mode of a method for operating a material delivery system according to an embodiment of the invention.

FIG. 3 illustrates an exemplary flow diagram of an operational mode 300 of a method for operating a material delivery system according to an embodiment of the invention. It is to be understood that the following description of the operational mode 300 is but one manner of a variety of different manners in which an embodiment of the invention may be practiced. It should also be apparent to those of ordinary skill in the art that the operational mode 300 represents a generalized illustration and that other steps may be added or existing steps may be removed, modified or rearranged without departing from the scope of the invention.

The description of the operational mode 300 is made with reference to the block diagram 200 illustrated in FIG. 2 and the systems 100, 150, and 160 illustrated in FIGS. 1A–1C, respectively, and thus makes reference to the elements cited therein. It should, however, be understood that the operational mode 300 is not limited to the elements set forth in the block diagram 200 nor the systems 100,150, and 160. Instead, it should be understood that the operational mode 300 may be practiced with systems having different configurations than that presented in the block diagram 200 and the systems 100, 150, and 160.

The operational mode 300 may be initiated in response to a variety of stimuli at step 302. For example, the operational mode 300 may be initiated in response to a manual instruction by an operator, a predetermined lapse of time, in response to receipt of a transmitted signal, etc. Once initiated, at step 304, pressure may be applied to the material 104 contained in the reservoir 102. The pressure may be applied by a pressure applying means 112, 208 as described in greater detail hereinabove. In addition, the pressure applying means 112, 208 may apply a substantially uniform amount of pressure onto the material 104. In general, the amount of pressure applied to the material 104 may be consonant with the fluid column length and exit velocity from a nozzle 108. In addition, through application of the pressure by the pressure applying means 112, 208, the material 104 is channeled through an arcuate section 110, 110' prior to reaching the nozzle 108. As also described hereinabove, the arcuate section 110, 110' may be useful in substantially preventing blockage of the nozzle 108.

The application of pressure on the material 104 also generally causes the material 104 to jet from the nozzle 108 after it has passed through the arcuate section 110, 110' as indicated at step 306. In addition, an acoustic wave is generated through the fluid column 118 formed by the material 104 jetting from the nozzle 108 at step 308. The acoustic wave may be generated by a PZT transducer 122, 214 located proximate the nozzle 108. Droplets 120 break off from the fluid column 118 as dictated by the Rayleigh instability.

One or more of the droplets 120 from the fluid column 118 are electrically charged by a charging ring 126, 216 at step 310. The manner in which the droplet(s) 120 receive electrical charge is described in detail hereinabove. After traveling through the charging ring 126,216, the droplets 120 travel past a pair of deflection plates 128, 218. The deflection plates 128, 218 generally operate to alter the trajectories of charged droplets 120.

At step 312, the controller 204 may determine whether certain ones or all of the droplets 120 are to be discarded. Certain ones of the droplets 120 may be discarded, for instance, if it is determined that those droplets 120 do not need to be applied to the substrate 108. If the controller 204 determines that certain ones of the droplets 120 are to be discarded, the controller 204 may control the deflection plates 128, 218 to emit an electrostatic charge to cause the determined ones of the droplets 120 to be diverted to the collection plate 130 at step 314. In addition, if the controller 204 determines that none of the droplets 120 are to be discarded or for those droplets 120 that are intended to reach the substrate, the controller 204 may determine whether the trajectories of those droplets 120 that received charges are to be altered at step 316. The controller 204 may determine that the trajectories of certain ones of the droplets 120 are to be altered to vary their positions on the substrate 108.

If the controller 204 determines that one or more of the droplet 120 trajectories are to be altered, the controller 204 may operate the deflection plates 128, 218 to emit an electrostatic charge to alter the trajectories of the desired droplets 120 at step 318. This may be accomplished, for instance, by varying the amount and polarity of the electrical charge applied by the deflection plates 128, 218.

At step 320, the controller 204 may determine whether the velocity of one or more of the droplets 120 should be altered. More particularly, the controller 204 may determine whether it will be beneficial to either accelerate or decelerate one or more of the droplets 120 prior to their impacting the substrate 108. If the velocities of one or more of the droplets 120 are to be altered, the controller 204 may control a electrostatic charge device 224 of the support plate 132, 220 to emit an electrostatic charge at step 322. To accelerate a droplet 120, the controller 204 may operate the electrostatic charge device 224 to emit an electrostatic charge having an opposite polarity to that of the charge of the droplet 120. Conversely, to decelerate a droplet 120, the controller 204 may operate the electrostatic charge device 224 to emit an electrostatic charge having the same polarity as that of the charge of the droplet 120.

At step 324, the controller 204 may determine whether the substrate 108 is to be moved. For instance, the controller 204 may determine that the substrate 108 should be moved in a system where the substrate 108 is required to be moved to facilitate positioning the droplets 120 at various locations on the substrate 108. In this type of configuration, the controller 204 may determine that the substrate 108 is to be moved to allow for the droplets 120 to be positioned at various locations on the substrate 108 to, for instance, create electronic circuit components. If the controller 204 determines that the substrate 108 is to be moved, the controller 204 may operate one or more actuators 222 of the support plate 132, 220 to reposition the substrate 108 at step 326. Otherwise, the controller 204 may determine whether the operational mode 300 is to continue at step 328.

If it is determined that the operational mode 300 is to continue, steps 304–328 may be repeated for any reasonably suitable period of time, e.g., indefinitely, until the fabrication of the electronic circuit is complete, etc. On the other hand, if it is determined that the operational mode 300 is to be discontinued, e.g., a time period expires, the electronic circuit is complete, etc., the operational mode 300 may end as indicated at step 330. As described hereinabove, the arcuate section 110, 110' of the reservoir 102 generally operates to prevent the material 104 from settling in the nozzle 108. Therefore, the operational mode 300 may be discontinued for relatively long periods of time without concern for nozzle 108 blockage.

The operations set forth in the operational mode 300 FIG. 3 may be contained as utilities, programs, or subprograms, in any desired computer accessible medium. In addition, the operational mode 300 may be embodied by computer programs, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 4:
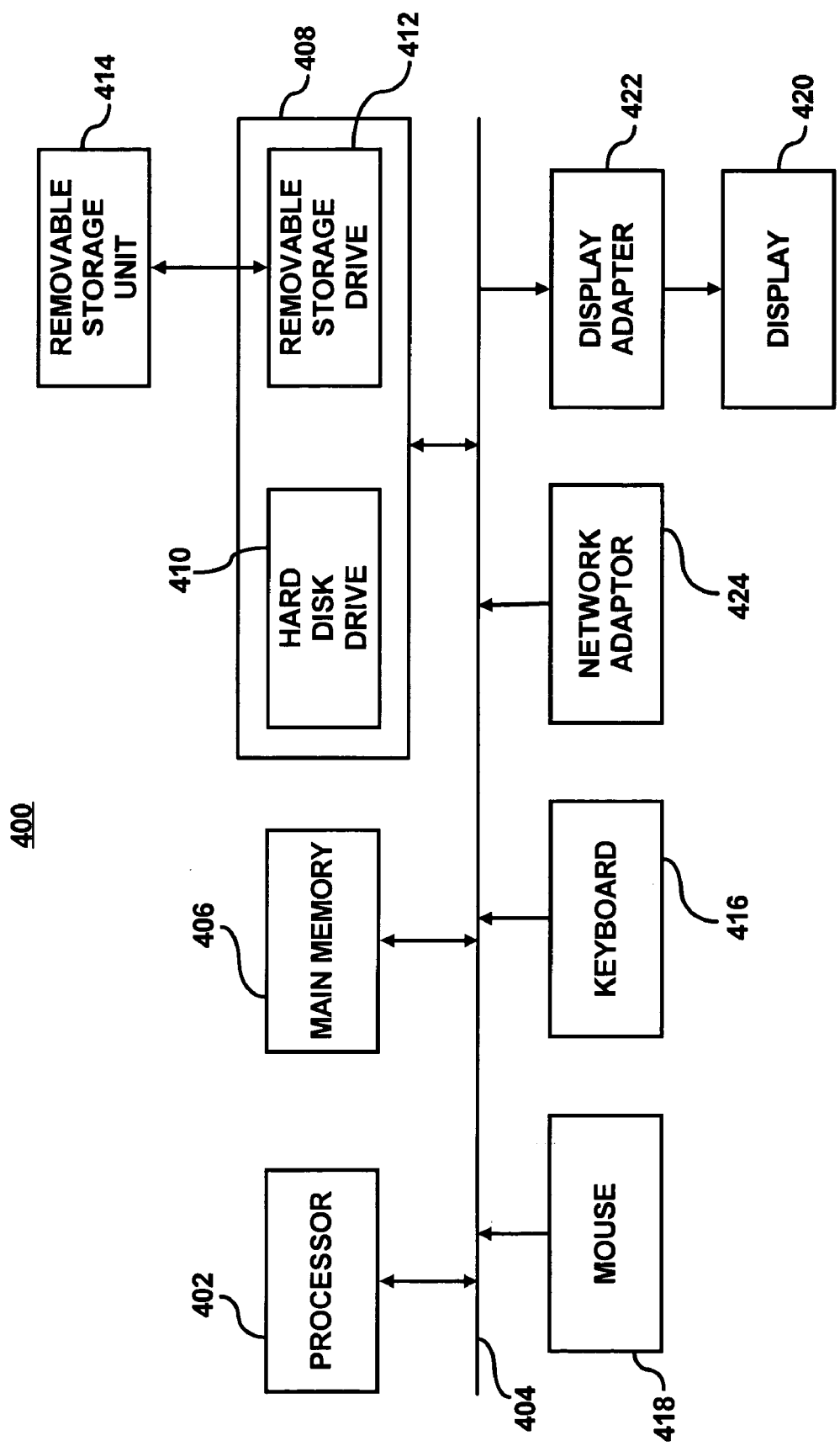
FIG. 4 illustrates an exemplary computer system, according to an embodiment of the invention.

FIG. 4 illustrates an exemplary computer system 400, according to an embodiment of the invention. The computer system 400 may include, for example, the controller 204. In this respect, the computer system 400 may be used as a platform for executing one or more of the functions described hereinabove with respect to the controller 204.

The computer system 400 includes one or more controllers, such as a processor 402. The processor 402 may be used to execute some or all of the steps described in the operational mode 300. Commands and data from the processor 402 are communicated over a communication bus 404. The computer system 400 also includes a main memory 406, e.g., memory 210, such as a random access memory (RAM), where the program code for the control scheme 202 may be executed during runtime, and a secondary memory 408. The secondary memory 408 includes, for example, one or more hard disk drives 410 and/or a removable storage drive 412, representing a floppy diskette drive, a magnetic tape drive, a compact disk drive, Flash based card/stick memory etc., where a copy of the program code for the control scheme 202 may be uploaded and/or stored.

The removable storage drive 410 reads from and/or writes to a removable storage unit 414 in a well-known manner. User input and output devices may include a keyboard 416, a mouse 418, a touch screen or a stylus (not shown), and a display 420. A display adaptor 422 may interface with the communication bus 404 and the display 420 and may receive display data from the processor 402 and convert the display data into display commands for the display 420. In addition, the processor 402 may communicate over a network, e.g., the Internet, LAN, etc., through a network adaptor 424.

It will be apparent to one of ordinary skill in the art that other known electronic components may be added or substituted in the computer system 400. In addition, the computer system 400 may include a system board or blade used in a rack in a data center, a conventional "white box" server or computing device, etc. Also, one or more of the components in FIG. 4 may be optional (e.g., user input devices, secondary memory, etc.).

Through implementation of the system and method according to embodiments of the invention, electronic circuits may be manufactured in a relatively simple and efficient manner. In addition, the means for jetting the materials from the reservoir does not suffer from the drawbacks associated with known mechanisms for printing circuit materials onto substrates. Thus, the system and method according to embodiments of the invention enable the fabrication of electronic circuits through use of a widely diverse range of materials covering, for instance, semiconductor materials, metals, dielectric, passivation and protective coating materials, etchants, dopants, reactants, etc. In addition, the amount of time required to apply materials onto substrates may be relatively reduced as compared with known systems through implementation of the continuous material flow schemes presented in the present invention.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A system for delivering material onto a substrate, said system comprising:
   a jetting assembly conifigured to deliver the material to the substrate as droplets;
   a charging ring, wherein said droplets are configured to pass through the charging ring, and wherein the charging ring is configured to induce an electrical charge to selective ones of the droplets;
   one or more deflection plates for altering a trajectory of the charged droplets;
   a support plate configured to support the substrate; and
   an electrostatic potential delivery device for delivering electrostatic potential to the support plate, wherein delivery of electrostatic potential to the support plate operates to vary the velocities at which the droplets impact the substrate.

2. The system according to claim 1, the jetting assembly further comprising:
   a reservoir containing the material, said reservoir having a nozzle through which the material is expelled from the reservoir;
   an arcuate section positioned between the reservoir and the nozzle, wherein the material is configured to travel from the reservoir, through the arcuate section, and through the nozzle;
   means for applying pressure on the material contained in the reservoir, wherein the material is expelled from the reservoir through application of pressure by the means for applying pressure to thereby create a column of the material from the nozzle; and
   means for producing pressure modulations located proximate the nozzle, the means for producing pressure modulations being configured to substantially regulate formation of droplets from the column of the material.

3. The system according to claim 2, wherein said arcuate section is configured to substantially prevent drying of the material in the nozzle.

4. The system according to claim 1, wherein said support plate is configured to move in two or more dimensions to thereby move the substrate.

5. The system according to claim 2, further comprising:
a collection plate positioned between the one or more deflection plates and the substrate, said collection plate being configured to receive unwanted droplets, and wherein said collection plate is configured to direct received droplets to at least one of a waste area and the reservoir.

6. The system according to claim 5, wherein the one or more deflection plates are configured to alter the trajectories of unwanted droplets into the collection plate.

7. The system according to claim 2, further comprising:
a heating mechanism configured to supply heat to the material contained in the reservoir.

8. The system according to claim 2, wherein the reservoir comprises a re-filling device configured to enable material to be inserted into the reservoir.

9. The system according to claim 2, wherein the reservoir comprises a separate component and wherein the reservoir is separately replaceable.

10. The system according to claim 2, further comprising:
a controller for controlling the means for applying pressure, the means for producing pressure modulations, the charging ring and the deflection plates.

11. The system according to claim 2, wherein the means for producing pressure modulations comprises a PZT transducer.

12. The system according to claim 2, further comprising:
a plurality of jetting assemblies;
a plurality of charging rings, wherein droplets from the plurality of jetting assemblies are configured to pass through respective ones of the plurality of charging rings; and
a plurality of deflection plates for altering the trajectories of the droplets from respective ones of the jetting assemblies.

13. The system according to claim 12, wherein the plurality of jetting assemblies contain different materials with respect to each other.

14. The system according to claim 12, wherein the plurality of jetting assemblies are positioned to substantially simultaneously deposit material onto the substrate.

15. The system according to claim 1, wherein the one or more deflection plates are configured to alter the trajectories of the droplets to various sections of the substrate.

16. The system according to claim 1, wherein the material comprises one or more of a semiconductor material, a metal, a dielectric, a passivation material, a protective coating material, an etchant, a dopant, and a reactant.

17. A method for depositing a material onto a substrate, said method comprising:
applying a pressure onto a material located in a reservoir, wherein said pressure causes the material to flow out of a nozzle in a fluid column;
creating pressure modulation through the fluid column to control formation of droplets from the fluid column, wherein the droplets travel along a flight path from the fluid column;
electrically charging one or more of the droplets;
depositing the one or more droplets onto the substrate;
determining whether a velocity at which the one or more droplets are deposited onto the substrate is to be altered prior to the step of depositing the one or more droplets onto the substrate; and
altering the velocities of the one or more droplets in response to a determination that the velocities at which the one or more droplets are deposited onto the substrate are to be altered.

18. The method according to claim 17, further comprising: varying the flight path of at least one of the one or more charged droplets.

19. The method according to claim 18, wherein the step of varying the flight path of at least one of the one or more charged droplets comprises inducing an electrostatic potential on the at least one of the one or more charged droplets to vary the flight path.

20. The method according to claim 18, further comprising:
determining whether at least one of the one or more charged droplets are to be discarded; and
wherein the step of varying the flight path of at least one of the one or more charged droplets comprises varying the flight path of one or more charged droplets to be discarded to direct the one or more charged droplets to be discarded to a collection plate.

21. The method according to claim 18, wherein the step of varying the flight path of at least one of the one or more charged droplets comprises varying the flight path of at least one of the one or more charged droplets having a charge/mass ratio falling outside of a predetermined charge/mass ratio range.

22. The method according to claim 17, further comprising:
determining one or more positions on the substrate for the one or more droplets to impact; and
directing at least one of the one or more droplets to impact the one or more positions on the substrate.

23. The method according to claim 22, further comprising:
determining whether a trajectory of the at least one of the one or more droplets is to be altered; and
wherein the step of directing the at least one of the one or more droplets to impact the one or more positions comprises varying the trajectory of the at least of the one or more droplets to vary the position of impact of the at least one of the one or more droplets on the substrate.

24. The method according to claim 17, further comprising:
determining one or more positions on the substrate for the one or more droplets to impact;
determining whether the substrate is to be moved to cause the one or more droplets to impact the one or more positions; and
moving the substrate in response to a determination that the substrate is to be moved to cause the one or more droplets to impact the one or more positions.

25. The method according to claim 17, further comprising:
determining one or more positions on the substrate for the one or more droplets to impact;
determining whether a trajectory of the at least one of the one or more droplets is to be altered and whether the substrate is to be moved to cause the one or more droplets to impact the one or more positions; and
altering the trajectory of the at least one of the one or more droplets and moving the substrate to cause the one or more droplets to impact the one or more positions.

26. The method according to claim 17, further comprising:
applying an electrostatic charge having the same polarity as the electrical charge of the one or more droplets to decrease the velocities of the one or more droplets; and applying an electrostatic charge having a different polarity than the electrical charge of the one or more droplets to increase the velocities of the one or more droplets.

27. The method according to claim 17, wherein the step of creating pressure modulations through the fluid column comprises creating acoustic waves with a PZT transducer.

28. The method according to claim 17, wherein the step of applying a pressure onto a material comprises applying a substantially uniform pressure onto the material.

29. The method according to claim 17, further comprising:
re-filling the reservoir with one or more of the material and a different material.

30. The method according to claim 17, further comprising:
replacing the reservoir with one or more of a reservoir containing the material and a reservoir containing a different material.

31. A system for delivering material onto a substrate, said system comprising:
means for housing the material;
means for applying pressure on the material;
means for expelling the material from the means for housing the material;
means for channeling the material from the means for housing to the means for expelling the material shape;
means for creating substantially uniform droplets from a column of material expelled from the means for expelling the material;
means for selectively charging the droplets;
means for moving the substrate in at least one dimensional plane; and
means for applying an electrostatic charge to the means for moving to vary the velocity of the charged droplets approaching the substrate.

32. The system according to claim 31, wherein the means for creating substantially uniform droplets comprises means for producing pressure modulations in the column of material.

33. The system according to claim 31, further comprising:
means for heating the material housed in the means for housing.

34. The system according to claim 31, further comprising:
means for deflecting one or more of the charged droplets.

35. The system according to claim 31, further comprising:
means for re-filling the reservoir with one or more of the material and a different material.

36. A computer readable storage medium on which is embedded one or more computer programs, said one or more computer programs implementing a method for depositing a material onto a substrate, said one or more computer programs comprising a set of instructions for:
applying a pressure onto a material located in a reservoir, wherein said pressure causes the material to flow out of a nozzle in a fluid column;
creating pressure modulation through the fluid column to control formation of droplets from the fluid column, wherein the droplets travel along a flight path from the fluid column;
electrically charging one or more of the droplets;
depositing the one or more droplets onto the substrate;
determining whether a velocity at which the one or more droplets are deposited onto the substrate is to be altered prior to the step of depositing the one or more droplets onto the substrate; and
altering the velocities of the one or more droplets in response to a determination that the velocities at which the one or more droplets are deposited onto the substrate are to be altered.

37. The computer readable storage medium according to claim 36, said one or more computer programs further comprising a set of instructions for:
varying the flight path of at least one of the one or more charged droplets.

38. The computer readable storage medium according to claim 37, said one or more computer programs further comprising a set of instructions for:
determining whether at least one of the one or more charged droplets are to be discarded; and
wherein the step of varying the flight path of at least one of the one or more charged droplets comprises varying the flight path of one or more charged droplets to be discarded to direct the one or more charged droplets to be discarded to a collection plate.

39. The computer readable storage medium according to claim 36, said one or more computer programs further comprising a set of instructions for:
determining one or more positions on the substrate for the one or more droplets to impact; and
directing at least one of the one or more droplets to impact the one or more positions on the substrate.

40. The computer readable storage medium according to claim 39, said one or more computer programs further comprising a set of instructions for:
determining whether a trajectory of the at least one of the one or more droplets is to be altered; and
wherein the step of directing the at least one of the one or more droplets to impact the one or more positions comprises varying the trajectory of the at least of the one or more droplets to vary the position of the at least one droplet on the substrate.

41. The computer readable storage medium according to claim 36, said one or more computer programs further comprising a set of instructions for:
determining one or more positions on the substrate for the one or more droplets to impact;
determining whether the substrate is to be moved to cause the one or more droplets to impact the one or more positions; and
moving the substrate in response to a determination that the substrate is to be moved to cause the one or more droplets to impact the one or more positions.

42. The computer readable storage medium according to claim 36, said one or more computer programs further comprising a set of instructions for:
determining one or more positions on the substrate for the one or more droplets to impact;
determining whether a trajectory of the at least one of the one or more droplets is to be altered and whether the substrate is to be moved to cause the one or more droplets to impact the one or more positions; and p1 altering the trajectory of the at least one of the one or more droplets and moving the substrate to cause the one or more droplets to impact the one or more positions.

43. The computer readable storage medium according to claim 36, said one or more computer programs further comprising a set of instructions for:
applying an electrostatic charge having the same polarity as the electrical charge of the one or more droplets to decrease the velocities of the one or more droplets; and
applying an electrostatic charge having a different polarity than the electrical charge of the one or more droplets to increase the velocities of the one or more droplets.

* * * * *